US010069500B2

(12) United States Patent
Kaajakari (10) Patent No.: US 10,069,500 B2
(45) Date of Patent: Sep. 4, 2018

(54) OVEN CONTROLLED MEMS OSCILLATOR (71) Applicant: Murata Manufacturing Co., Ltd., Nagaokakyo-shi, Kyoto-fu (JP)

(72) Inventor: Ville Kaajakari, Allendena, CA (US)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 194 days.

(21) Appl. No.: 15/209,875

(22) Filed: Jul. 14, 2016

(65) Prior Publication Data

US 2018/0019754 A1 Jan. 18, 2018

(51) Int. Cl.
| H03B 5/30 | (2006.01) |
| H03L 1/04 | (2006.01) |
| H03H 9/02 | (2006.01) |
| H03L 1/02 | (2006.01) |
| H03H 9/08 | (2006.01) |

(52) U.S. Cl.
CPC .............. *H03L 1/04* (2013.01); *H03B 5/30* (2013.01); *H03H 9/02* (2013.01); *H03H 9/02102* (2013.01); *H03H 9/02448* (2013.01); *H03H 9/08* (2013.01); *H03L 1/028* (2013.01)

(58) Field of Classification Search
CPC ........... H03B 5/30; H03H 2009/02496; H03H 3/0077; H03H 9/02062; H03H 9/02102; H03H 9/02401; H03H 9/02409; H03H 9/02448; H03H 9/02; H03H 2009/155; H03L 1/028; H03L 1/04
USPC .................. 331/154, 116 M, 107 A; 333/186
See application file for complete search history.

(56) References Cited

U.S. PATENT DOCUMENTS

| 5,283,458 | A | 2/1994 | Stokes et al. |
| 7,196,405 | B1 | 3/2007 | Ferreiro et al. |
| 7,988,351 | B2 | 8/2011 | Gabl et al. |
| 8,049,326 | B2 | 11/2011 | Najafi et al. |
| 8,410,868 | B2* | 4/2013 | Schoepf ............ H03H 9/02448 310/346 |
| 8,476,737 | B2 | 7/2013 | Najafi et al. |
| 8,669,823 | B1* | 3/2014 | Olsson .................... H03B 5/30 331/154 |
| 8,686,555 | B2 | 4/2014 | Yaralioglu et al. |

(Continued)

FOREIGN PATENT DOCUMENTS

EP           2530836 A1        12/2012

OTHER PUBLICATIONS

Lee, et al.; "A Low-Powered Oven-Controlled Vacuum Package Technology for High-Performance MEMS"; 2009 IEEE 22nd Conference on Micro Electro Mechanical Systems, pp. 753-756.

(Continued)

*Primary Examiner* — Arnold Kinkead
(74) *Attorney, Agent, or Firm* — Arent Fox LLP (57) ABSTRACT

An oven controlled MEMS timing device that includes a very small oscillator that can be heated very rapidly with very low power. The MEMS device includes a rectangular frame, a heated platform positing in the frame, and a pair of support beams that extend from the rectangular frame and hold the platform within a cavity of the frame to thermally isolate the platform. Moreover, the device includes a resonator attached to the platform by a pair of anchor beams, a heater that heats the platform to maintain a target temperature for the resonator and a thermistor that measures a temperature of the platform to provide a control loop for the heater.

19 Claims, 7 Drawing Sheets

(56) References Cited

U.S. PATENT DOCUMENTS

| | | |
|---|---|---|
| 8,729,973 B2 | 5/2014 | van Beek et al. |
| 9,030,080 B2 | 5/2015 | Chen et al. |
| 9,154,109 B2 * | 10/2015 | Inaba .................. H03H 3/0072 |
| 9,257,993 B2 | 2/2016 | Munaga et al. |
| 2007/0262831 A1 | 11/2007 | Van Beek et al. |
| 2010/0300201 A1 | 12/2010 | Ge et al. |
| 2010/0315179 A1 | 12/2010 | Schoepf et al. |
| 2012/0280594 A1 | 11/2012 | Chen et al. |
| 2013/0001765 A1 | 1/2013 | Yaralioglu et al. |
| 2014/0151869 A1 | 6/2014 | Yaralioglu et al. |
| 2015/0115377 A1 | 4/2015 | DeNatale et al. |

OTHER PUBLICATIONS

Ruby et al.; "Oven Controlled FBAR Oscillator"; 2015 IEEE International Ultrasonics Symposium Proceedings, pp. 1-4.

* cited by examiner

OVEN CONTROLLED MEMS OSCILLATOR

FIELD OF THE INVENTION

The present invention relates to a MEMS oscillator, and, more particularly, to an oven controlled MEMS oscillator with good temperature stability in a small size.

BACKGROUND OF THE INVENTION

Quartz crystals are widely used to provide reference frequencies in electronic oscillators. The frequency at which a quartz crystal resonator vibrates depends on its physical dimensions. Moreover, changes in temperature causes the quartz crystal to expand or contract due to thermal expansion and changes in the elastic modulus of quartz. The physical changes in turn change the crystal oscillation frequency. Although quartz has a very low temperature coefficient of frequency, temperature changes are still the major cause of frequency variation in crystal oscillators.

Oven controlled crystal oscillators ("OCXO") are frequency reference devices where the quartz oscillator is placed inside a temperature controlled oven. The oven is provided to maintain the oscillator at a constant temperature in order to prevent changes in the frequency due to variations in ambient temperature. This type of oscillator achieves the highest frequency stability possible with a quartz crystal. OCXOs are typically used to control the frequency of radio transmitters, cellular base stations, military communications equipment, and devices for precision frequency measurements, for example.

For OCXOs, the oven is a thermally-insulating enclosure that contains the crystal and one or more electrical heating elements. Since other electronic components in the oscillator circuit are also vulnerable to temperature drift, usually the entire oscillator circuit is enclosed in the oven. For these devices, a temperature sensor, such as thermistor, will be provided to monitor the oven temperature and a closed-loop control circuit will be provided to control the power to the heater to maintain the oven at the precise target temperature. Since the oven operates above ambient temperature, the oscillator usually requires a warm-up period of several minutes after the power has been applied. Moreover, the frequency of the device will not have the full rated stability during this warm-up period.

Although existing OCXOs generally provide good stability (e.g., typically better than 100 parts per billion ("ppb") over a specified temperature range), these devices also have several shortcomings. First, a typical quartz crystal is fairly large, which, turn, makes the final OCXO devices quite large. Since the manufacturing cost of the timing device is proportional to the size, the larger OCXO size is not preferred. Second, the long thermal time constant for heating and cooling leads to a very long start-up time. For example, it typically takes several minutes to stabilize the oven at the target temperature. Third, the power needed to maintain the oven temperature is fairly large. For example, a typical OCXO consumes over 1 watt to heat the oven. Finally, due to temperature gradients in the oven, the crystal temperature is not constant but may change by +/−1 K over an ambient temperature range of −40 to 85 C.

SUMMARY OF THE INVENTION

Microelectromechanical system ("MEMS") resonators are small electromechanical structures that vibrate at high frequencies and are often used as an alternative to Quartz crystals. The present disclosure overcomes the technical disadvantages of existing OCXO devices, as discussed above, by provide an oven controlled MEMS timing device that includes a very small oscillator that can be heated very rapidly with very low power.

In one embodiment, an oven controlled MEMS oscillator includes a rectangular frame; a platform disposed within the frame; one or more support beams extending from the rectangular frame and affixed to one end of the platform to hold the platform within a cavity of the frame such that the platform is thermally isolated from the frame; a resonator coupled to the platform by a pair of anchor beams disposed on opposing first sides of the resonator; a thermistor disposed on the platform at least between the one end of the platform and the resonator; and a heater configured to heat the platform and maintain a target temperature in response to a temperature measured by the thermistor.

In another embodiment, the platform, the resonator, and the support beams are all disposed in a same plane. Preferably, the heater and the temperature sensor are formed by a same metal deposition.

In an exemplary embodiment, the temperature sensor comprises a serpentine shape and is disposed on opposing sides of the resonator adjacent to the pair of anchor beams, respectively. Moreover, the heater is preferably disposed on the one end of the platform between the respective sides where the pair of support beams are affixed to platform. In an alternative embodiment, the heater comprises a pair of heating elements disposed on the pair of support beams, respectively.

Preferably, the rectangular frame is formed from a silicon-on-insulator wafer. Moreover, the resonator and the platform are preferably etched in the silicon-on-insulator wafer of the frame.

In an exemplary embodiment, the resonator is disposed in a center of the platform and the temperature sensor is disposed between the resonator and the at least one support beam. Moreover, in one embodiment, a width of the platform between an edge of the platform and the resonator is at least two times a thickness of the platform.

According to another embodiment, a timing device is provided that includes a ceramic carrier; oscillation circuitry disposed on the ceramic carrier; an oven lid affixed to the ceramic carrier to form a first oven covering the oscillation circuitry; a first heater disposed on the ceramic carrier and configured to heat the first oven to a first temperature; and a MEMS oven controlled resonator disposed on the ceramic carrier and electrically coupled to the oscillation circuitry. Moreover, in this embodiment, the MEMS oven controlled resonator includes a substrate, a rectangular frame disposed on the substrate, a resonator cap attached to the rectangular frame to form a second oven, a platform disposed within the frame, a pair of support beams configured to hold the platform within a cavity of the frame, a resonator coupled to the platform, a temperature sensor disposed on the platform at least between the one end of the platform and the resonator, and a heater configured to heat the platform to maintain the second oven at a second temperature higher than the first temperature in response to a temperature measured by the temperature sensor.

The above simplified summary of example embodiments serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and particularly pointed out in the claims.

BRIEF DESCRIPTION OF THE DRAWINGS

The accompanying drawings, which are incorporated into and constitute a part of this specification, illustrate one or more example embodiments of the present disclosure and, together with the detailed description, serve to explain their principles and implementations. The drawings provided are for illustrative purposes only and are therefore not drawn to scale.

DETAILED DESCRIPTION OF THE EMBODIMENTS

Example aspects are described herein in the context of an oven controlled micromechanical oscillator (hereinafter "OCMO") that overcomes many of the technical disadvantages of existing oscillator devices. In particular, the OCMO disclosed herein is small-sized oscillator that can be heated very rapidly with very low power.

Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1:
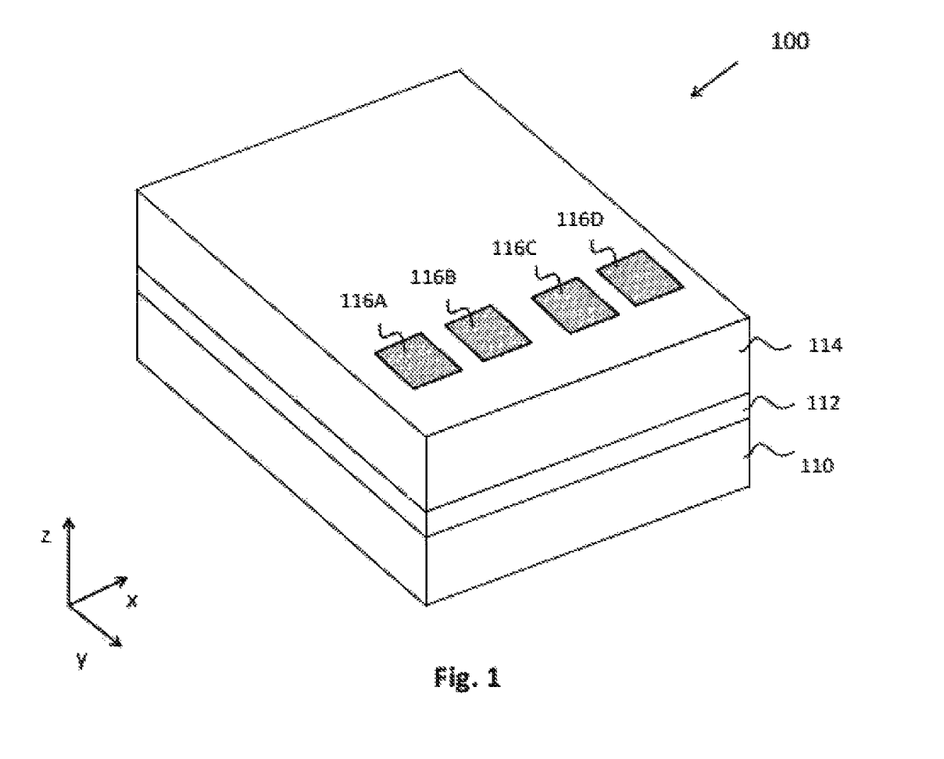
FIG. 1 illustrates an outer perspective view of an oven controlled micromechanical resonator in accordance with an exemplary embodiment.

FIG. 1 illustrates an outer perspective view of an oven controlled micromechanical resonator in accordance with an exemplary embodiment. As shown, the MEMS resonator device 100 includes a frame 112 and a resonator cap 114 that are provided upon a substrate 110. As will be discussed below and shown in FIG. 3, for example, substrate 110 includes a concave cavity C in a central area thereof, such that a resonator inside the MEMS resonator device 100 is capable of vibrating above the cavity C.

Figure 6:
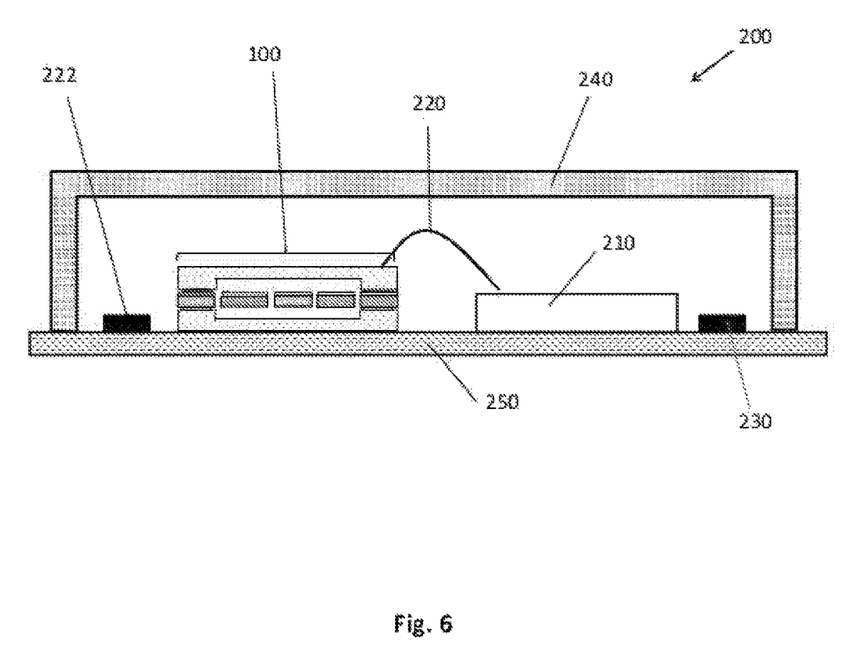
FIG. 6 illustrates a timing device including the MEMS resonator 100 in accordance with an exemplary embodiment.

Preferably, the MEMS resonator device 100 of the exemplary embodiment is manufactured with MEMS manufacturing techniques, for example, as described in "Fundamentals of Microfabrication and Nanotechnology, Volume II: Manufacturing Techniques for Microfabrication and Nanotechnology", by Marc J. Madou, CRC Press, 2011. Thus, according to the exemplary embodiment, the MEMS resonator device 100 is a chip scale packaged ("CSP") micromechanical resonator. Preferably, the MEMS resonator device 100 is fabricated of cavity silicon-on-insulator ("SOI") wafers with the substrate 110 made of silicon, the frame 112 made of SOI silicon, and the resonator cap 114 visible to outside. As further shown, a plurality of electrical contact pads (e.g., contact pads 116A though 116D) are provided on top of the resonator cap 114 for connecting the resonator to oscillation circuitry, as would be understood to one skilled in the art, an example of which is shown in FIG. 6 and discussed below.

Figure 2A:
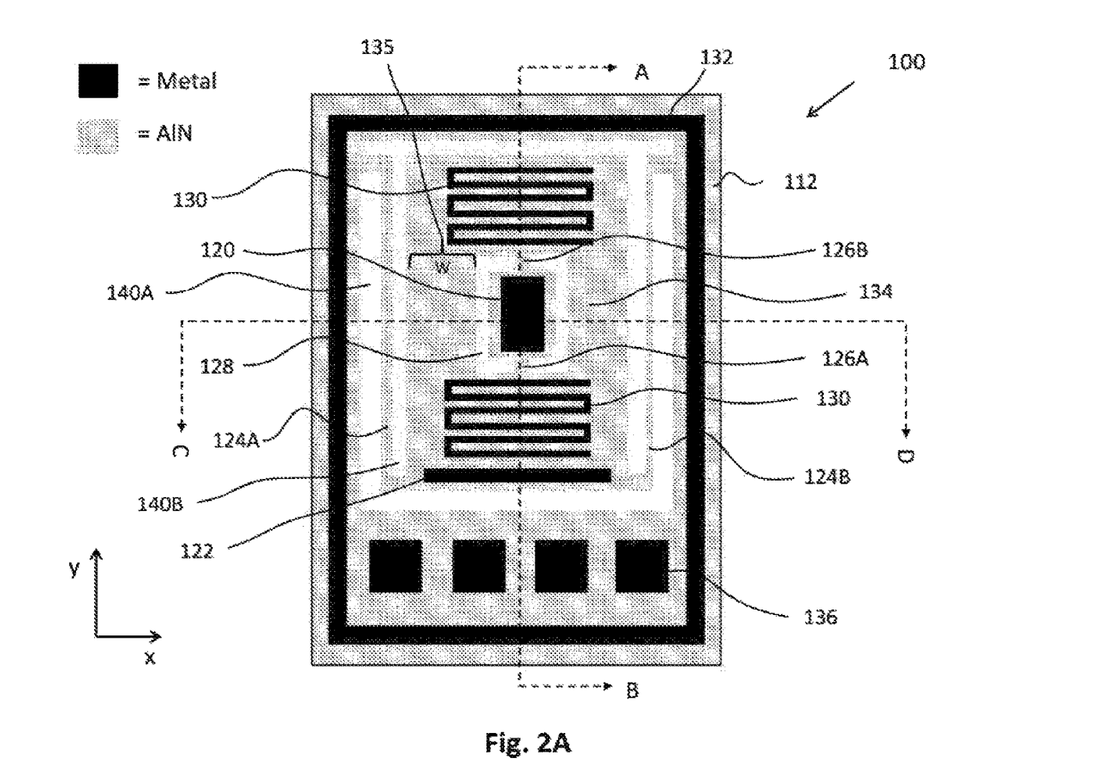
FIG. 2A illustrates a cross sectional view of the MEMS resonator of FIG. 1 in accordance with an exemplary embodiment.
Figure 2B:
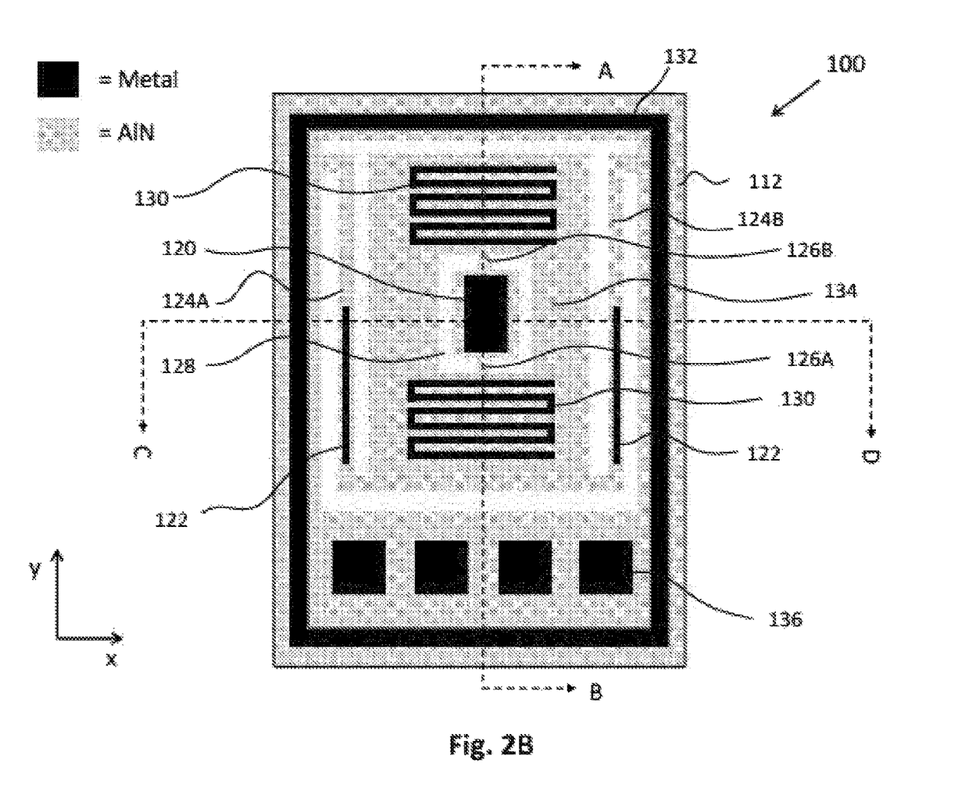
FIG. 2B illustrates a cross sectional view of the MEMS resonator of FIG. 1 in accordance with another exemplary embodiment.

FIG. 2A illustrates a cross sectional view of the MEMS resonator 100 of FIG. 1 in accordance with an exemplary embodiment. Moreover, FIG. 2B illustrates a cross sectional view of the MEMS resonator of FIG. 1 in accordance with another exemplary embodiment, the details of which will be discussed below. The views shown in FIGS. 2A and 2B are cross section views of the MEMS resonator device 100 taken along the cross section of the frame 112 without the resonator cap 114 attached thereto.

As shown in FIG. 2A, the MEMS resonator device 100 includes a resonator 120 disposed on a rectangular plate and secured to a heated platform 134 by two thin anchor beams 126A and 126B that are coupled to opposing first sides of the resonator 120. According to an exemplary embodiment, the resonator 120 is preferably a bulk acoustic mode resonator that vibrates in-plane mode (i.e., the motion is mostly in x/y plane) as these types of modes provide higher quality factor and power handling capacity. For example, according to this aspect, the vibration modes are preferably the width extensional mode and the Lamé-mode. Moreover, according to the exemplary embodiment, the thin anchor beams 126A and 126B minimize the vibrational energy loss from the resonator 120 to the heated platform 134.

Due to vibration coupling between the resonator 120 and the platform 134 through the anchor beams 126A and 126B, there is a risk of unwanted resonances that combine the vibrations of the resonator 120 and platform 134. To minimize these unwanted spurious resonances, the platform 134 should be mechanically rigid. Moreover, according to an exemplary embodiment, the unwanted spurious resonances can be minimized when the platform 134 completely surrounds the resonator 120 and the width 135 of the platform 134 (i.e., between an outer edge of the platform 134 and cavity 128) surrounding the resonator 120 is at least 2× the thickness of the platform 134 and preferably at least 4× the thickness of the resonator 120.

As further shown, the heated platform 134 includes heater 122 to provide the oven effect to heat the platform 134 and a temperature sensor, i.e., a thermistor 130, provided to measure the temperature of the heated platform 134. Moreover, the platform 134 is supported by support beams 124A and 124B that connect the heated platform 134 to the package frame 112. The support beams 124A and 124B are connected to the platform 134 substantially on one end. This arrangement is beneficial as it ensures a most uniform heat distribution over the platform 134 since the heat flow out of the platform 134 on from this end. As shown, the support beams 124A and 124B extend vertically (i.e., in the y direction) with cavities (e.g., 140A and 140B along beam 124A) also extending on both sides of each support beam 124A and 124B. As a result, the heated platform 134 is thermally isolated from the frame 112. The symmetric structure of the pair of support beams 124A and 124B provides good support against mechanical shocks. Moreover, the long length of the support beams 124A and 124B where the beam extends over the length of the platform 134 ensures good thermal isolation of the platform 134.

As shown in FIG. 2A, each of the pair of support beams 124A and 124B includes a short first portion that extends in a widthwise direction of the oscillator (i.e., in the x direction), a second long portion that extends in a lengthwise direction of the oscillator (i.e., in the y direction) and in parallel to sides of the platform, and a third portion that again extends in the widthwise direction of the oscillator (i.e., in the x direction) and that is coupled to the respective sides of the one end of the platform. It should be appreciated that alternative structural configurations can be provided for the support beams 124A and 124B (for example a single support beam can be used to affix the platform 134 to the frame 112) and/or that additional support beams can be provided according to alternative embodiments.

Moreover, according to an exemplary embodiment, the heater 122 is positioned near the support beams 124A and 124B (e.g., between or adjacent to where the support beams 124A and 124B are attached to the platform 134). As shown, the support beams 124A and 124B are attached to sides of a first end of the heated platform 134. The heater 122 extends between the sides of the heated platform 134 where the support beams 124A and 124B are attached with the thermistor disposed between the heater 122 and the resonator 120. In preferred embodiment, the thermistor 130 is disposed on two sides of the resonator 120 (i.e., between the resonator 124 and heater 122 and between the resonator 120 and side of the platform 134 opposing the thermistor 130). This ensures that if there is any thermal gradient in the platform, the thermistor will read the average temperature in the platform.

According to this configuration, when the heater 122 is on, the heat power generated by the heater 122 raises the temperature of the platform 134 and heat flows through the beams 124A and 124B. In steady state, the heat power and heat flow balances and substantially all heat power flows through the support beams 124A and 124B. Due to the heat flow, there is a large temperature gradient across support beams 124A and 124B; however, as the heat flow is from the heater 122 to the support beams 124A and 124B, the remaining portion of the platform 134 is at uniform temperature. If the heater 122 was located on the opposite side of the platform compared to the connection points of the support beams 124A and 124B, there would be a constant heat flow across the platform 134 from heater 122 to the support beams 124A and 124B resulting in large temperature gradients and poor temperature control. In other words, in preferred embodiment, the heater 122 should be located in the area defined by the connections of the support beams 124A and 124B on one side and the resonator 120 and temperature sensor 130 positioned on other side of the platform 134.

According to an alternative embodiment, the heater 122 includes a pair of heating elements that can be positioned on the support beams 124A and 124B themselves, as shown in FIG. 2B, for example. FIG. 2B illustrates an alternative embodiment to FIG. 2A, but otherwise has the some components except for the positioning of the heater 122 on the support beams 124A and 124B. Thus, the identical components of FIG. 2B will not be separately described herein.

By positioning the heater 122 between the support beams 124A and 124B (i.e., FIG. 2A) or on the support beams 124A and 124B (i.e., FIG. 2B), these configuration result in a uniform or a substantially uniform platform temperature profile. Moreover, the thermistor(s) 130 should be located close to the resonator 120 to ensure that the temperature of the resonator 120 can be accurately measured. As shown in FIGS. 2A and 2B, the thermistor 130 is disposed on the heated platform 134 adjacent to both anchoring beams 126A and 126B. As further shown, there is a cavity 128 that surrounds the rectangular plate holding the resonator 120, including on two second opposing sides of the resonator 120, except where the resonator 120 is anchored to the heated platform 134 by anchoring beams 126A and 126B. The anchoring beams 126A and 126B connect to the resonator 120 near the resonator nodal point (e.g., a centerline of the resonator during vibration) to minimize the energy leakage from resonator 120 to the platform 134 and allow optimization of the resonator 120 and heated platform 134 separately. In the exemplary embodiment, the resonator 120 is a width extensional bulk acoustic mode resonator and the two anchoring beams 126A and 126B attach to the nodal points at two short sides of the rectangular resonator 120. If other resonators are used, the number of anchor beams may be different in such embodiments. For example for Lamé-mode resonators, four anchor beams may be used to anchor to the beam corners. In either configuration, the resonator 120 is capable of vibrating in the cavity 128 during operation of the MEMS resonator device 100. Moreover, the heated platform 134 is rectangular shaped and surrounds the resonator.

Moreover, as noted above with respect to FIG. 1, the resonator cap 114 includes a plurality of electrical contact pads 116A though 116D. As shown in FIG. 2, the MEMS resonator device 100 includes a plurality of electrical via contacts 136 (only one via contact is marked with reference numeral 136) that are electrically coupled to the electrical contact pads 116A though 116D in the cap 114. Furthermore, the frame 112 includes a metal bonding ring 132 that facilitates bonding of the frame 112 to the resonator cap 114 during manufacture of the device 100, as would be understood to one skilled in the art.

Furthermore, according to an exemplary embodiment and as will be discussed in more detail below, the thermistor 130, heater 122, and electrode layer(s) of the resonator 120, can be formed by depositing the same metal (e.g., molybdenum) during manufacturing. Using the same materials for these components helps reduce manufacturing steps and minimize manufacturing costs, as would be appreciated to one skilled in the art.

Figure 3:
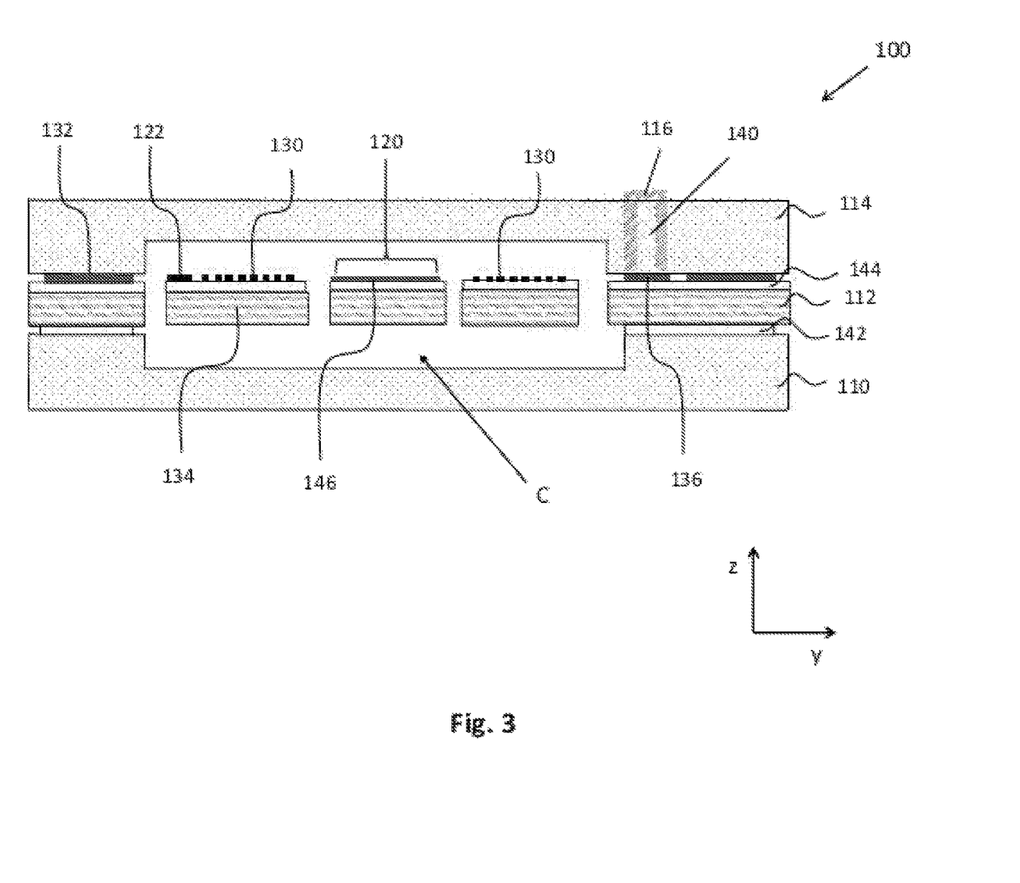
FIG. 3 is a cross-sectional side view of the oven controlled micromechanical resonator taken along an A-B line indicated in FIG. 2.

FIG. 3 is a cross-sectional side view of the oven controlled MEMS resonator 100 taken along an A-B line indicated in FIG. 2. According to the exemplary embodiment, the resonator 120 and the heated platform 134 are etched of the same SOI silicon that is used from the frame 112. Moreover, there are several thin film layers deposited on top of the SOI silicon.

Specifically, a piezoelectric layer 144, preferably formed from AlN is formed on top of the SOI silicon layer, with a lower excitation electrode and an upper excitation electrode disposed on the top and bottom surfaces, respectively, of the piezoelectric layer 144. The electrodes (only the upper electrode is shown as reference number 146) are preferably formed from molybdenum and together with the AlN layer 144 are used for piezoelectric actuation of the resonator 120. As noted above, the same metal can also be used to form the heater 122 and thermistor 130. It should be appreciated that alternative/additional thin film layers may also be used for resonator 120 according to alternative embodiments.

As the support arms 124A and 124B, the heated platform 134, the anchoring beams 126A and 126B, and the resonator 120 are all etched of the same silicon layer, manufacturing is simplified, but the inclusion of the anchor beams 126A and 126B still allows a separate optimization of resonator 120 and support platform 134.

According to additional embodiments, the MEMS resonator device 100 may include multiple metal layers that can be used for signal routing and to reduce the resistive signal losses. Moreover, in one embodiment, silicon dioxide layers 142 may incorporated below and/or above the SOI silicon used for the frame 112 to provide for thermal compensation of the resonator 120. Preferably, the SOI silicon (i.e., the frame 112) is bonded to the substrate 110 with the silicon dioxide insulating layer 142. Moreover, it is preferable that the substrate 110 has a cavity C so the heated platform 134 and resonator 120 do not easily contact the substrate 110, for example, if the resonator device 100 experiences a mechanical shock. Moreover, according to an exemplary embodiment, the resonator cap 114 is bonded with a metal eutectic bond by the metal bonding ring 132. Metal bonds are also used for making a contact to the electrical vias 140 in the resonator cap 114.

As can readily be seen in FIG. 3, the resonator 120 is disposed in a cavity C defined by the substrate 110 and the resonator cap 114. Accordingly, when the heater 122 heats the platform 134, the heated platform 134 is preferably heated to a first temperature that stabilizes the temperature of the "oven" defined by cavity C, and effectively, heats the resonator 120. The thermistor 130 is disposed in the same plane as the heater 122 (i.e., in the x,y plane) and is also preferably disposed on both sides of the resonator 120 to ensure an accurate temperature measurement of the temperature of the resonator 120. As a result, the thermistor 130 is configured to provide feedback control to the heater 122 as part of a closed-loop control system to actively regulate the temperature of the resonator 120, as will be understood by those skilled in the art. Any suitable known feedback control system for active temperature control may be employed. For example, according to one embodiment, the thermal control loop electronics are located off the resonator 100 chip on a printed circuit board that includes circuitry coupled to the heater 122 and thermistor 130. Here, the details of such circuitry are not described in detail so as to not unnecessarily obscure the aspects of the invention.

Figure 4:
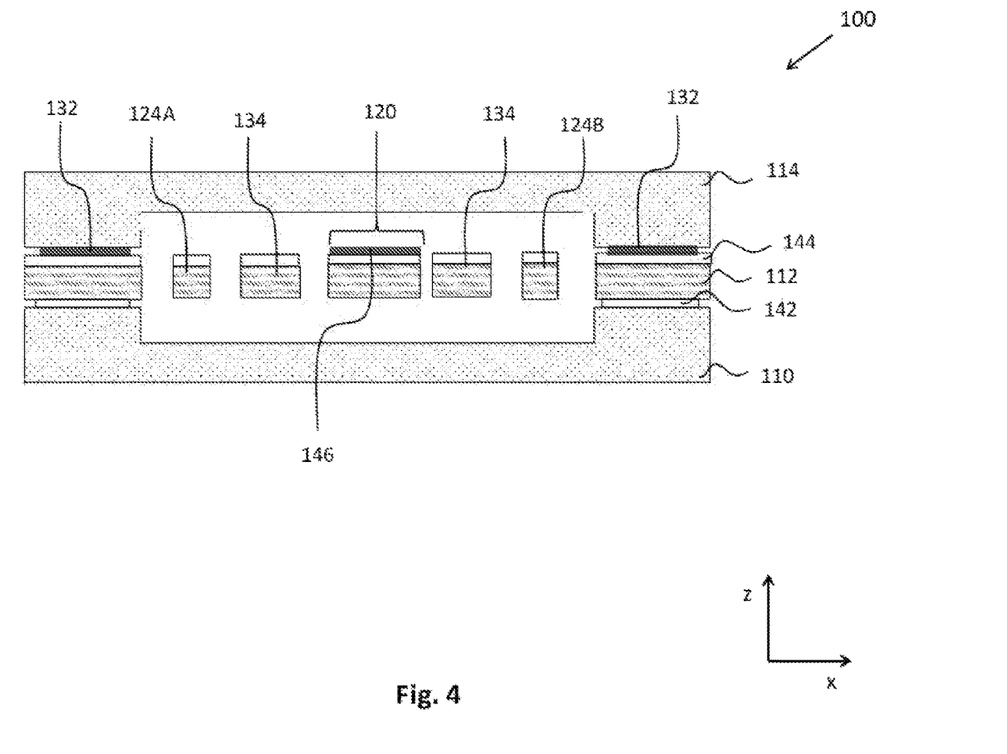
FIG. 4 is a cross-sectional side view of the oven controlled micromechanical resonator taken along an C-D line indicated in FIG. 2.

FIG. 4 is a cross-sectional side view of the oven controlled MEMS resonator 100 taken along an C-D line indicated in FIG. 2. Preferably, the thickness of the SOI silicon for the frame layer 112 is between 5 μm and 30 μm. Moreover, the piezoelectric layer 144 preferably has a thickness between 0.5 μm and 2 μm and the metal electrodes (e.g., metal electrode 146) has a thickness that is typically 1 μm or less. Moreover, if other thin film layers are used, such as silicon dioxide layer 142, they also have a thickness that is typically 1 μm or less.

According to an exemplary embodiment, the lateral dimensions of the resonator are 300 μm by 600 μm. Moreover, as shown in FIG. 2, the heated platform 134 is rectangular shaped and is large enough to support the resonator 120 and the thermistor 130. The thermistor 130 preferably comprises a serpentine shape in order to maximize the resistance per unit area. According to the exemplary embodiment, the total area of the thermistor 130 may be 400 μm by 400 μm and the thickness of the thermistor 130 may be 0.2 μm, for example.

The heater 122 may be small in comparison to the thermistor 130 and should be placed near or on the support beams 124A and 124B, as discussed above and shown in FIGS. 2A and 2B. In the exemplary embodiment, the support beam 124A and 124B have a width of 10 μm and length 400 μm, for example, to be thermally isolating, but still rigid enough for mechanical support of the heated platform 134. The anchor beams 126A and 126B preferably have a width that is typically less than 5 μm in order to minimize the vibrational energy leakage and to maximize the mechanical resonator quality factor.

The oven controlled MEMS resonator 100 disclosed herein provides many technical advantages when compared with conventional systems, such as the OCXO devices described above. For example, because the heated platform 134 has a small thermal mass, i.e., it requires minimal heat energy to reach a desired temperature, the time constant for heating and cooling the heated platform 134, and, effectively, the resonator 120, is small. In particular, the resonator 120 can be heated to the target temperature in 100 ms or less according to the exemplary embodiment. In addition, the heated platform 134 is thermally isolated, as shown above in FIGS. 2A and 2B, since the platform 134 is coupled to frame 112 only by support beams 124A and 124B that are connected at one end of the heated platform 134. As a result, the pressure inside the package can be reduced to improve the quality factor of the resonator 120 and eliminate thermal convection through air. For example, a typical package pressure may be 100 Pa or less. The main heat loss mechanism is the heat flow through support beams which can be long to provide large thermal resistance. For example, two silicon support beams with thickness of 10 μm, width 10 μm, length 400 μm will have thermal resistance of 15 K/mW. This means that just 5 mW is sufficient to heat the resonator by 75 degrees, which is a significantly smaller amount of required heating power than needed in conventional OCXO devices (e.g., 1 W), as discussed above.

Figure 5:
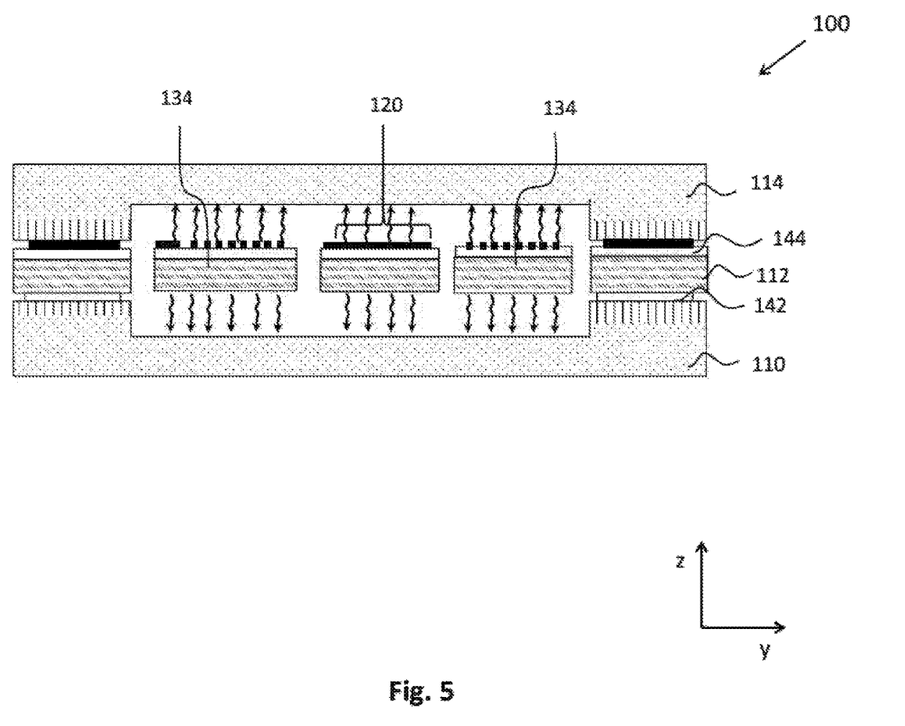
FIG. 5 is another cross-sectional side view of the oven controlled micromechanical resonator taken along an A-B line indicated in FIG. 2.

Although the thermal convection loss is eliminated with low pressure packaging, the heated platform 134 and the resonator 120 also lose heat via radiation as is illustrated in FIG. 5. In particular, FIG. 5 is another cross-sectional side view of the oven controlled MEMS resonator 100 taken along an A-B line indicated in FIG. 2.

As shown in FIG. 5, heat dissipation is illustrate by arrows extending from the heated platform 134 and the resonator 120. According to an exemplary embodiment, the platform 134 is heated to temperature T1, but the package temperature T2 can be lower. The temperature differential will result in radiation losses. In general, radiation loss is detrimental in maintaining a constant temperature for the resonator 120 since radiation loss results in temperature gradients in the heated platform 134 and, therefore, the resonator 120. As a result, the temperature of the thermistor 130 may differ from the temperature of the resonator 120, resulting in incorrect temperature reading. If the temperature is measured incorrectly, the temperature of the resonator 120 will differ from the target temperature causing a frequency change.

In the present embodiment, the thermistor 130 is formed as part of the heated platform 134 (as shown above) and the thermal coupling to the resonator 120 is very good. Thus, even with the radiation losses as shown in FIG. 5, the temperature error will be less than 1 K, and typically 0.1 K.

FIG. 6 illustrates a timing device 200 including the MEMS resonator 100 in accordance with an exemplary embodiment. Preferably, the timing deice 200 shown in FIG. 6 can be used in applications for wireless base stations, GPS receivers, and other systems requiring accurate time or frequency reference, for example.

As shown for this embodiment, the exemplary resonator device 100, described above, can be placed inside another oven to further reduce the radiation induced temperature errors. Specifically, the timing device 200 includes the resonator 100 disposed on a carrier 250. The carrier 250 may be a ceramic substrate or printed circuit board (PCB), for example. Moreover, an outer oven lid 240 is secured to the carrier 250 to house the resonator 100 and the associated oscillation circuitry 210 that is connected to the resonator 100 by a wire bond 220. The lid 240 may be a metal lid, for example. A second heater 222 is provided on the carrier 250 to heat the outer oven and a second thermistor 230 is also provided on the carrier 250 to measure the outer temperature to ensure that the heater 222 is adjusted to maintain the target temperature.

In this embodiment, the outer oven temperature T2 can be the same or slightly lower than the temperature T1 inside the resonator 100 (i.e., the temperature of resonator 120 discussed above). For example, the resonator 120 may be heated to 95° C. and the outer oven may be heated to 85° C., according to an exemplary embodiment. As a result, the radiation loss is small and constant over the ambient temperature variations. Advantageously, the timing device 200 is configured to stabilize the oscillation circuitry 210 at a constant temperature that is the same or less than the circuit inside resonator 100.

In the interest of clarity, not all of the routine features of the embodiments are disclosed herein. It should be appreciated that in the development of any actual implementation of the present disclosure, numerous implementation-specific decisions must be made in order to achieve the designer's specific goals, and these specific goals will vary for different implementations and different designers. It is understood that such a design effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by those skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

While the foregoing has been described in conjunction with exemplary embodiments, it is understood that the term "exemplary" is merely meant as an example. Accordingly, the application is intended to cover alternatives, modifications and equivalents, which may be included within the spirit and scope of the MEMS resonator disclosed herein.

REFERENCE SIGNS LIST

100: MEMS resonator device
110: substrate layer
112: frame
114: resonator cap
116A-116D: electrical contact pads
120: resonator
122, 222: heater
124A & 124B: support beams
126A & 126B: anchor beams
128: cavity
130, 230: thermistor
132: metal bonding ring
134: heated platform
136: via contacts
140A, 140B: cavities
142: silicon dioxide layer
144: AlN layer
146: electrode
200: timing device
210: oscillation circuitry
220: wire bond
240: outer oven lid
250: carrier

The invention claimed is:

1. An oven controlled MEMS oscillator comprising:
a frame;
a platform disposed within the frame;
at least one support beam extending from the frame and affixed to one end of the platform to hold the platform within a cavity of the frame such that the platform is thermally isolated from the frame;
a resonator coupled to the platform by at least a pair of anchor beams;
a temperature sensor disposed on the platform at least between the one end of the platform and the resonator; and
a heater configured to heat the platform and maintain a target temperature in response to a temperature measured by the temperature sensor,
wherein the resonator is disposed in a center of the platform and the temperature sensor is disposed between the resonator and the at least one support beam.

2. The oven controlled MEMS oscillator according to claim 1, wherein the platform, the resonator, and the at least one support beam are all disposed in a same plane.

3. The oven controlled MEMS oscillator according to claim 1, wherein the heater and the temperature sensor are formed by a same metal deposition.

4. The oven controlled MEMS oscillator according to claim 1, wherein the at least one support beam comprises a pair of support beams extending from the frame and affixed to respective sides of the one end of the platform.

5. The oven controlled MEMS oscillator according to claim 4, wherein the heater is disposed on the one end of the platform between the respective sides where the pair of support beams are affixed to platform.

6. The oven controlled MEMS oscillator according to claim 1, wherein the temperature sensor comprises a serpentine shape thermistor and is disposed on opposing sides of the resonator.

7. An oven controlled MEMS oscillator comprising:
a frame;
a platform disposed within the frame;
at least one support beam extending from the frame and affixed to one end of the platform to hold the platform within a cavity of the frame such that the platform is thermally isolated from the frame;
a resonator coupled to the platform by at least a pair of anchor beams;
a temperature sensor disposed on the platform at least between the one end of the platform and the resonator; and
a heater configured to heat the platform and maintain a target temperature in response to a temperature measured by the temperature sensor,
wherein the heater comprises a pair of heating elements disposed on the pair of support beams, respectively.

8. An oven controlled MEMS oscillator comprising:
a frame;
a platform disposed within the frame;

at least one support beam extending from the frame and affixed to one end of the platform to hold the platform within a cavity of the frame such that the platform is thermally isolated from the frame;
a resonator coupled to the platform by at least a pair of anchor beams;
a temperature sensor disposed on the platform at least between the one end of the platform and the resonator; and
a heater configured to heat the platform and maintain a target temperature in response to a temperature measured by the temperature sensor,
wherein the frame comprises a silicon-on-insulator layer and the resonator and the platform are etched in the silicon-on-insulator layer of the frame.

9. The oven controlled MEMS oscillator according to claim 1, wherein the pair of anchor beams are coupled to opposing sides of the resonator adjacent to a nodal point of the resonator.

10. The oven controlled MEMS oscillator according to claim 1, wherein a width of the platform between an edge of the platform and the resonator is at least two times a thickness of the platform.

11. An oven controlled MEMS oscillator comprising:
a frame;
a platform disposed within the frame;
at least one support beam extending from the frame and affixed to one end of the platform to hold the platform within a cavity of the frame such that the platform is thermally isolated from the frame;
a resonator coupled to the platform by at least a pair of anchor beams;
a temperature sensor disposed on the platform at least between the one end of the platform and the resonator;
a heater configured to heat the platform and maintain a target temperature in response to a temperature measured by the temperature sensor; and
a resonator cap bonded to the frame by a metal ring.

12. The oven controlled MEMS oscillator according to claim 1, wherein the resonator is bulk acoustic mode resonator.

13. A timing device comprising:
a carrier;
oscillation circuitry disposed on the carrier
an oven lid affixed to the carrier to form a first oven covering the oscillation circuitry;
a first heater disposed on the carrier and configured to heat the first oven to a first temperature;
a MEMS oven controlled resonator disposed on the carrier and electrically coupled to the oscillation circuitry, the MEMS oven controlled resonator including:
a substrate,
a rectangular frame disposed on the substrate,
a resonator cap attached to the rectangular frame to form a second oven,
a platform disposed within the frame,
at least one support beam configured to hold the platform within a cavity of the frame,
a resonator coupled to the platform,
a temperature sensor disposed on the platform at least between the one end of the platform and the resonator, and
a second heater configured to heat the platform to maintain the second oven at a second temperature higher than the first temperature in response to a temperature measured by the temperature sensor.

14. The timing device according to claim 13, wherein the resonator is coupled to the platform by a pair of anchor beams disposed on opposing first sides of the resonator.

15. The timing device according to claim 13, wherein the at least one support beam comprises a pair of support beams that extend from the rectangular frame and are affixed to respective sides of the one end of the platform to hold the platform within a cavity of the frame such that the platform is thermally isolated from the frame.

16. The timing device according to claim 13, wherein the platform, the resonator, and the at least one support beam of the MEMS oven controlled resonator are all disposed in a same plane.

17. The timing device according to claim 13, wherein the second heater and the temperature sensor of the MEMS oven controlled resonator are formed by a same metal deposition.

18. The timing device according to claim 13, wherein the second heater is disposed on the one end of the platform between the at least one support beam and the resonator.

19. The timing device according to claim 13, wherein the second heater comprises a pair of heating elements disposed on the pair of support beams, respectively, of the MEMS oven controlled resonator.

* * * * *

UNITED STATES PATENT AND TRADEMARK OFFICE
CERTIFICATE OF CORRECTION

PATENT NO. : 10,069,500 B2
APPLICATION NO. : 15/209875
DATED : September 4, 2018
INVENTOR(S) : Ville Kaajakari Page 1 of 1

It is certified that error appears in the above-identified patent and that said Letters Patent is hereby corrected as shown below:

On the Title Page

Under item (72) Inventor reads as:
Ville Kaajakari, Allendena, CA (US)
It should read as:
Ville Kaajakari, Altadena, CA (US)

Signed and Sealed this
Twenty-second Day of January, 2019

Andrei Iancu
*Director of the United States Patent and Trademark Office*